(12) United States Patent
Endo et al.

(10) Patent No.: US 6,841,488 B2
(45) Date of Patent: Jan. 11, 2005

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 66 days.

(21) Appl. No.: 10/279,070

(22) Filed: Oct. 24, 2002

(65) Prior Publication Data

US 2003/0082926 A1 May 1, 2003

(30) Foreign Application Priority Data

Oct. 31, 2001 (JP) .......................................... 2001-334168

(51) Int. Cl.$^7$ .......................... H01L 21/302; G03C 5/00
(52) U.S. Cl. ..................... 438/725; 438/949; 430/328
(58) Field of Search .............................. 438/694, 725, 438/949; 430/328

(56) References Cited

U.S. PATENT DOCUMENTS

| | | | | |
|---|---|---|---|---|
| 4,307,176 A | * | 12/1981 | Mochiji et al. | 430/270.1 |
| 4,448,636 A | * | 5/1984 | Baber | 438/670 |
| 5,472,826 A | * | 12/1995 | Endo et al. | 430/311 |
| 5,527,662 A | * | 6/1996 | Hashimoto et al. | 430/296 |
| 6,040,118 A | * | 3/2000 | Capodieci | 430/328 |
| 6,048,661 A | * | 4/2000 | Nishi et al. | 430/270.1 |
| 6,270,929 B1 | * | 8/2001 | Lyons et al. | 430/5 |
| 6,331,378 B1 | * | 12/2001 | Endo | 430/314 |
| 6,642,148 B1 | * | 11/2003 | Ghandehari et al. | 438/694 |
| 2001/0036732 A1 | * | 11/2001 | Yoshida et al. | 438/689 |
| 2003/0082486 A1 | * | 5/2003 | Endo et al. | 430/322 |

FOREIGN PATENT DOCUMENTS

JP 2001-308076 11/2001

* cited by examiner

*Primary Examiner*—Matthew Smith
*Assistant Examiner*—Lex H. Malsawma
(74) *Attorney, Agent, or Firm*—McDermott Will & Emery LLP

(57) ABSTRACT

A resist film is formed from a chemically amplified resist material including a base polymer having a protecting group released by a function of an acid, an acrylic compound and an acid generator that generates an acid when irradiated with light. The resist film is selectively irradiated with exposing light for pattern exposure, and is developed after the pattern exposure so as to form a resist pattern having a hole or groove opening. The size of the opening is reduced by irradiating the resist pattern with light with annealing.

18 Claims, 3 Drawing Sheets

PATTERN FORMATION METHOD

BACKGROUND OF THE INVENTION

The present invention relates to a pattern formation method including a step of reducing a size of an opening formed in a resist pattern by allowing the resist pattern to flow.

In fabrication process for a semiconductor integrated circuit device, a resist pattern formed by lithography has been further reduced in accordance with increase of the degree of integration of a semiconductor integrated circuit and refinement of a semiconductor device.

In particular, in the formation of a resist pattern having an opening used for forming a hole or a groove in a film to be processed, the contrast is lowered in the conventional lithography technique as the size of the hole or the groove is reduced. Therefore, it has become difficult to form an opening used for forming a fine hole or groove.

As countermeasure, technique has been proposed in which the size of a hole or groove opening formed in a resist pattern is reduced by allowing the resist pattern to thermally flow, whereby forming, in the resist pattern, an opening with a fine size beyond the limit of the lithography technique.

Now, the conventional pattern formation method will be described with reference to FIGS. 3A through 3E.

First, a chemically amplified resist material having the following composition is prepared:

Base polymer: poly((2-methyl-2-adamantyl methacrylate)-(γ-butyrolactone methacrylate) (wherein 2-methyl-2-adamantyl methacrylate: γ-butyrolactone methacrylate=50 mol %: 50 mol %) . . . 1 g Acid generator: triphenylsulfonium nonafluorobutane-sulfonate . . . 0.03 g Solvent: propylene glycol monomethyl ether acetate . . . 4 g Next, as shown in FIG. 3A the chemically amplified resist material having the aforementioned composition is applied on a substrate 1, so as to form a resist film 2 with a thickness of 0.5 μm. Then, as shown in FIG. 3B, the resist film 2 is irradiated for pattern exposure with ArF excimer laser 3 emitted from an ArF excimer laser scanner (with NA of 0.60) through a photomask 4 having a desired mask pattern.

Thereafter, as shown in FIG. 3C, the resist film 2 is subjected to post-exposure bake (PEB) at a temperature of 105° C. for 90 seconds. In this manner, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

Next, the resist film 2 is developed with a 2.38 wt % tetramethylammonium hydroxide developer (an alkaline developer) for 60 seconds, so as to form a resist pattern 7 having an opening 6 with a size $W_1$ of 0.20 μm as shown in FIG. 3D.

Then, the resist pattern 7 is subjected to annealing 8 at 150° C., so as to allow the resist pattern 7 to flow as shown in FIG. 3E. In this manner, the size $W_1$ (=0.20 μm) of the opening 6 is reduced to a size $W_2$ (=0.15 μm).

Thus, a resist pattern having an opening with a fine size beyond the limit of the lithography technique can be formed.

However, as shown in FIG. 3E, the opening 6 whose size has been reduced through the flow is disadvantageously largely degraded in its cross-sectional shape.

Furthermore, variation in the size on a wafer plane of the openings 6, which have been reduced in the size through the flow, is 20% or more, which is disadvantageously too large.

If a resist pattern having such openings that have degraded cross-sectional shapes and are varied in their sizes is used for etching a film to be processed, the shape can be degraded or the sizes can be varied in resultant contact holes or interconnect grooves, which lowers the yield of semiconductor devices.

SUMMARY OF THE INVENTION

In consideration of the above-described conventional problems, an object of the invention is reducing the size of an opening formed in a resist film without degrading the shape of the opening.

In order to achieve the object, the first pattern formation method of this invention includes the steps of forming a resist film from a chemically amplified resist material including a base polymer having a protecting group released by a function of an acid, an acrylic compound and an acid generator that generates an acid when irradiated with light; selectively irradiating the resist film with exposing light for pattern exposure; forming a resist pattern having a hole or groove opening by developing the resist film after the pattern exposure; and reducing a size of the opening by irradiating the resist pattern with light with annealing.

Since the chemically amplified resist material used in the first pattern formation method includes the base polymer having a protecting group and the acrylic compound, the acrylic compound is present between the base polymers to cause crosslinkage of the base polymers when the resist pattern made from the chemically amplified resist material is irradiated with light with annealing. Therefore, the shape of the opening formed in the resist pattern is not degraded. As a result, the size of the opening can be reduced without degrading the shape of the opening formed in the resist pattern.

In the first pattern formation method, the acrylic compound is preferably acrylic acid or acrylate.

Thus, the crosslinkage can be definitely caused between the base polymers.

The second pattern formation method of this invention includes the steps of forming a resist film from a chemically amplified resist material including a base polymer having a protecting group released by a function of an acid, a thermally crosslinking compound for thermally crosslinking the base polymer and an acid generator that generates an acid when irradiated with light; selectively irradiating the resist film with exposing light for pattern exposure; forming a resist pattern having a hole or groove opening by developing the resist film after the pattern exposure; and reducing a size of the opening by annealing the resist pattern.

Since the chemically amplified resist material used in the second pattern formation method includes the base polymer having a protecting group and the thermally crosslinking compound, the thermally crosslinking compound is present between the base polymers to cause crosslinkage between the base polymers when the resist pattern made from the chemically amplified resist material is annealed. Therefore, the shape of the opening formed in the resist pattern is not degraded. As a result, the size of the opening can be reduced without degrading the shape of the opening formed in the resist pattern.

In the second pattern formation method, the thermally crosslinking compound is preferably a melamine compound.

Thus, the crosslinkage can be definitely caused between the base polymers.

In the first or second pattern formation method, the protecting group can be an acetal group, a t-butyl group or a t-butyloxycarbonyl group.

The third pattern formation method of this invention includes the steps of forming a resist film from a chemically amplified resist material containing a first polymer including a hydroxystyrene derivative having an acetal group as a protecting group released by a function of an acid, a second polymer including a norbornene derivative and an acid generator that generates an acid when irradiated with light; selectively irradiating the resist film with exposing light for pattern exposure; forming a resist pattern having a hole or groove opening by developing the resist film after the pattern exposure; and reducing a size of the opening by annealing the resist pattern.

In the third pattern formation method, since the second polymer including the norbornene derivative improves the contrast in thermal flow of the first polymer including the hydroxystyrene derivative having an acetal group, namely, the second polymer suppresses the thermal flow in the vicinity of the opening formed in the resist pattern, the shape of the opening formed in the resist pattern is not degraded. As a result, the size of the opening can be reduced without degrading the shape of the opening formed in the resist pattern.

The fourth pattern formation method of this invention includes the steps of forming a resist film from a chemically amplified resist material containing a first polymer including a hydroxystyrene derivative having an acetal group as a protecting group released by a function of an acid, a second polymer including a norbornene derivative—maleic anhydride and an acid generator that generates an acid when irradiated with light; selectively irradiating the resist film with exposing light for pattern exposure; forming a resist pattern having a hole or groove opening by developing the resist film after the pattern exposure; and reducing a size of the opening by annealing the resist pattern.

In the fourth pattern formation method, since the second polymer including the norbornene derivative—maleic anhydride improves the contrast in thermal flow of the first polymer including the hydroxystyrene derivative having an acetal group, namely, the second polymer suppresses the thermal flow in the vicinity of the opening formed in the resist pattern, the shape of the opening formed in the resist pattern is not degraded. As a result, the size of the opening can be reduced without degrading the shape of the opening formed in the resist pattern.

The fifth pattern formation method of this invention includes the steps of forming a resist film from a chemically amplified resist material containing a first polymer including a hydroxystyrene derivative having an acetal group as a protecting group released by a function of an acid, a second polymer including a norbornene derivative, a third polymer including a norbornene derivative—maleic anhydride and an acid generator that generates an acid when irradiated with light; selectively irradiating the resist film with exposing light for pattern exposure; forming a resist pattern having a hole or groove opening by developing the resist film after the pattern exposure; and reducing a size of the opening by annealing the resist pattern.

In the fifth pattern formation method, since the second polymer including the norbornene derivative and the third polymer including the norbornene derivative—maleic anhydride improve the contrast in thermal flow of the first polymer including the hydroxystyrene derivative having an acetal group, namely, the second and third polymers suppress the thermal flow in the vicinity of the opening formed in the resist pattern, the shape of the opening formed in the resist pattern is not degraded. As a result, the size of the opening can be reduced without degrading the shape of the opening formed in the resist pattern.

In any of the third through fifth pattern formation methods, the acetal group can be an ethoxyethyl group or a tetrahydropyranyl group.

DETAILED DESCRIPTION OF THE INVENTION

Embodiment 1

A pattern formation method according to Embodiment 1 of the invention will now be described with reference to FIGS. 1A through 1E. A chemically amplified resist material used in Embodiment 1 includes a base polymer having a protecting group released by a function of an acid; an acrylic compound; and an acid generator that generates an acid when irradiated with light.

Figure 1A:
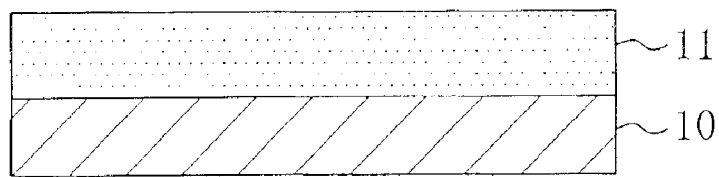
FIGS. 1A, 1B, 1C, 1D and 1E are cross-sectional views for showing procedures in a pattern formation method according to Embodiment 1 of the invention.
Figure 1B:
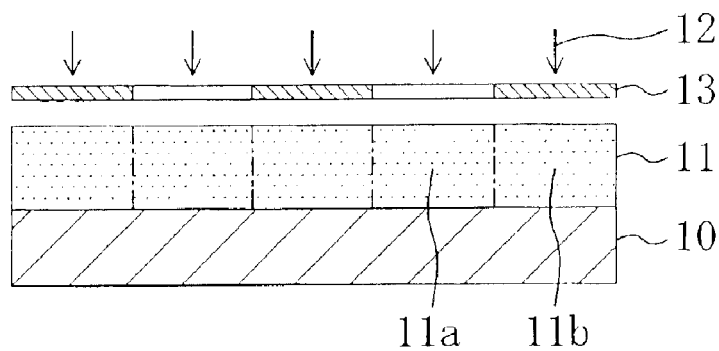

Specifically, a chemically amplified resist material having the following constituents is prepared:

Base polymer: poly((2-methyl-2-adamantyl methacrylate)-(γ-butyrolactone methacrylate) (wherein 2-methyl-2-adamantyl methacrylate: γ-butyrolactone methacrylate=50 mol %: 50 mol %) . . . 1 g Acrylic compound: acrylic acid . . . 0.2 g Acid generator: triphenylsulfonium nonafluorobutanesulfonate . . . 0.03 g Solvent: propylene glycol monomethyl ether acetate . . . 4 g Next, as shown in FIG. 1A, the chemically amplified resist material is applied on a substrate 10, so as to form a resist film 11 with a thickness of 0.5 μm. Then, as shown in FIG. 1B, the resist film 11 is irradiated for pattern exposure with ArF excimer laser 12 emitted from an ArF excimer laser scanner (with NA of 0.60) through a photomask 13 having a desired mask pattern.

Figure 1C:
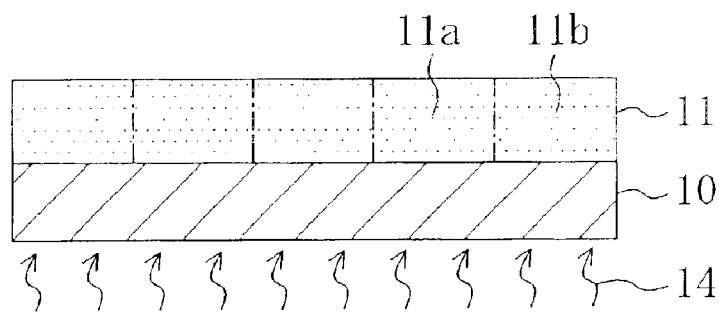

Then, as shown in FIG. 1C, the resist film 11 is subjected to post-exposure bake (PEB) 14 at a temperature of 105° C. for 90 seconds. In this manner, an exposed portion 11a of the resist film 11 becomes soluble in an alkaline developer because an acid is generated from the acid generator therein while an unexposed portion 11b of the resist film 11 remains insoluble in an alkaline developer because no acid is generated from the acid generator therein.

Figure 1D:
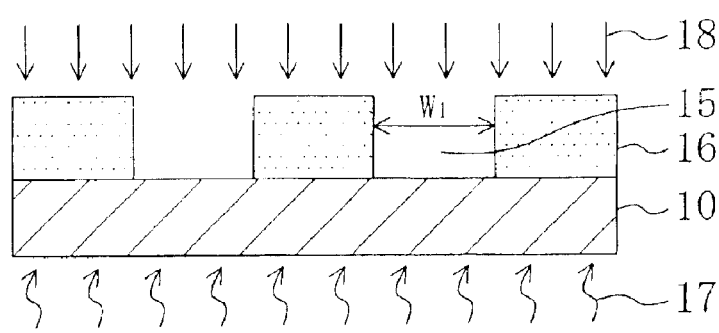

Next, the resist film 11 is developed with a 2.38 wt % tetramethylammonium hydroxide developer (an alkaline developer) for 60 seconds, so as to form a resist pattern 16 having an opening 15 with a size $W_1$ of 0.20 μm as shown in FIG. 1D.

Figure 1E:
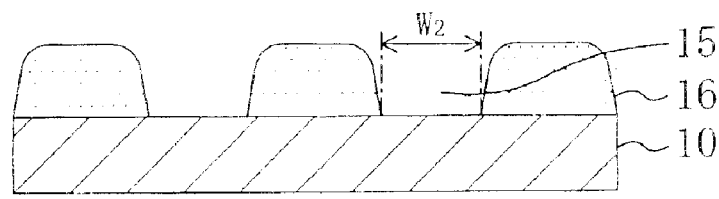

Then, the resist pattern 16 is irradiated with ArF excimer laser 18 with annealing 17 at 150° C., so as to allow the resist pattern 16 to flow as shown in FIG. 1E.

In this manner, the size $W_1$ (=0.20 μm) of the opening 15 is reduced to a size $W_2$ (=0.15 μ) while the cross-sectional shape of the opening 15 is minimally degraded. Also, variation in the size on a wafer plane of the openings 15 is as small as 10% or less.

In Embodiment 1, the resist pattern 16 formed by using the chemically amplified resist material having the aforementioned composition is irradiated with the ArF excimer laser with annealing as described above. Therefore, in the base polymer included in the resist pattern 16, the acrylic compound is present between the base polymers so as to cause crosslinkage therebetween. As a result, the shape of the opening 15 formed in the resist pattern 16 is not degraded. Accordingly, the size of the opening 15 can be reduced without degrading the shape of the opening 15 formed in the resist pattern 16.

Embodiment 2

A pattern formation method according to Embodiment 2 of the invention will now be described with reference to FIGS. 2A through 2E. A chemically amplified resist material used in Embodiment 2 includes a base polymer having a protecting group released by a function of an acid; a thermally crosslinking compound for thermally crosslinking the base polymer; and an acid generator that generates an acid when irradiated with light.

Figure 2A:
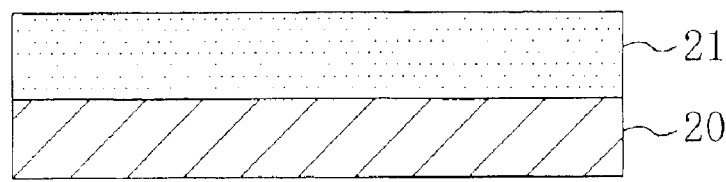
FIGS. 2A, 2B, 2C, 2D and 2E are cross-sectional views for showing procedures in a pattern formation method according to Embodiment 2 of the invention.
Figure 2B:
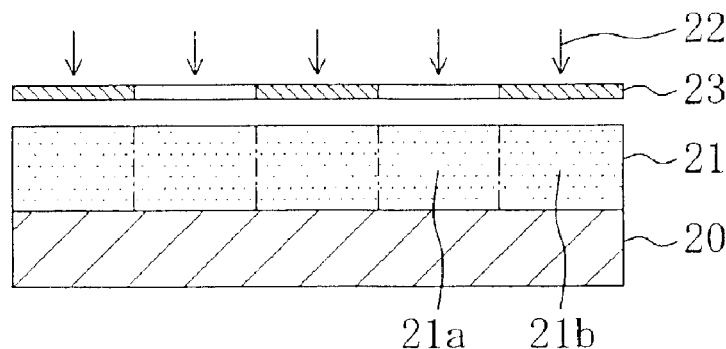

Specifically, a chemically amplified resist material having the following constituents is prepared:

Base polymer: poly((2-methyl-2-adamantyl methacrylate)-(γ-butyrolactone methacrylate) (wherein 2-methyl-2-adamantyl methacrylate: γ-butyrolactone methacrylate=50 mol %: 50 mol %) . . . 1 g Thermally crosslinking compound: melamine compound (such as 2,4,6-tris (methoxymethyl)amino-1,3,5-s-triazine) . . . 0.2 g Acid generator: triphenylsulfonium nonafluorobutanesulfonate . . . 0.025 g Acid generator: triphenylsulfonium trifluoromethanesulfonate . . . 0.01 g Solvent: propylene glycol monomethyl ether acetate . . . 4 g Next, as shown in FIG. 2A, the chemically amplified resist material is applied on a substrate 20, so as to form a resist film 21 with a thickness of 0.5 μm. Then, as shown in FIG. 2B, the resist film 21 is irradiated for pattern exposure with ArF excimer laser 22 emitted from an ArF excimer laser scanner (with NA of 0.60) through a photomask 23 having a desired mask pattern.

Figure 2C:
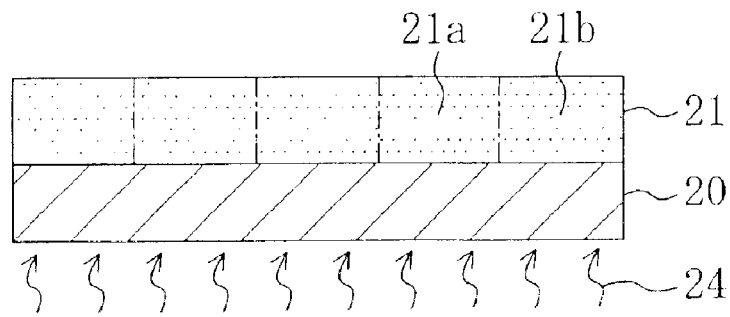

Then, as shown in FIG. 2C, the resist film 21 is subjected to post-exposure bake (PEB) 24 at a temperature of 105° C. for 90 seconds. In this manner, an exposed portion 21a of the resist film 21 becomes soluble in an alkaline developer because an acid is generated from the acid generator therein while an unexposed portion 21b of the resist film 21 remains insoluble in an alkaline developer because no acid is generated from the acid generator therein.

Figure 2D:
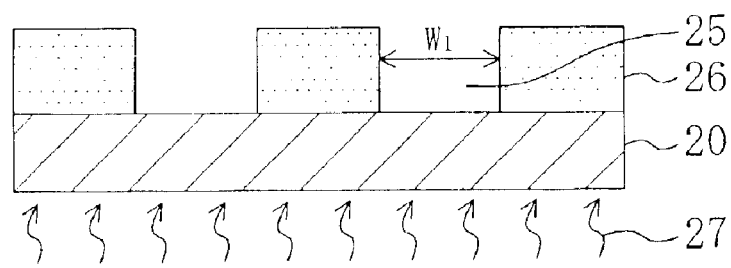

Next, the resist film 21 is developed with a 2.38 wt % tetramethylammonium hydroxide developer (an alkaline developer) for 60 seconds, so as to form a resist pattern 26 having an opening 25 with a size $W_1$ of 0.20 μm as shown in FIG. 2D.

Figure 2E:
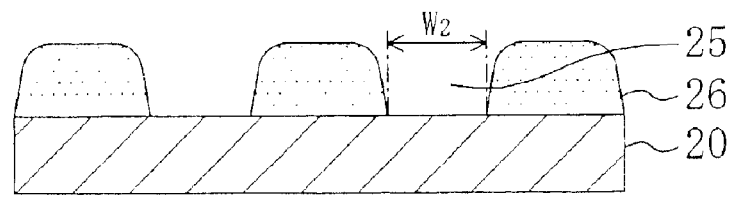
Figure 3A:
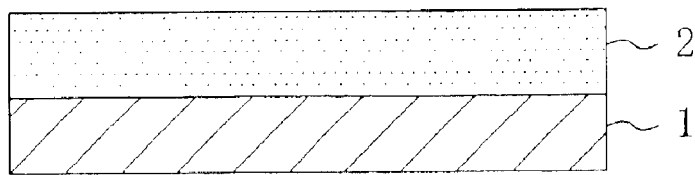
FIGS. 3A, 3B, 3C, 3D and 3E are cross-sectional views for showing procedures in a conventional pattern formation method.
Figure 3B:
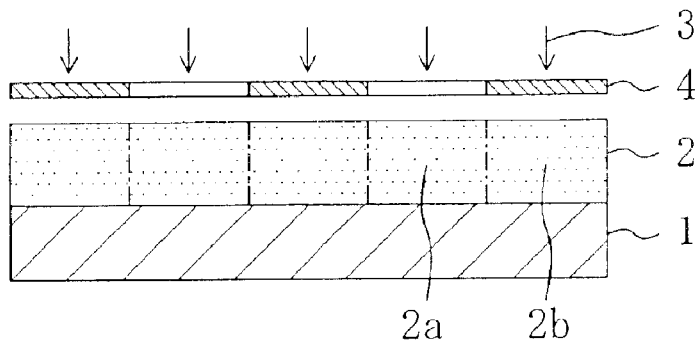
Figure 3C:
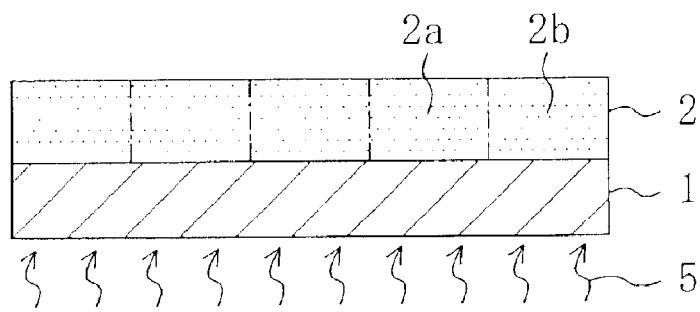
Figure 3D:
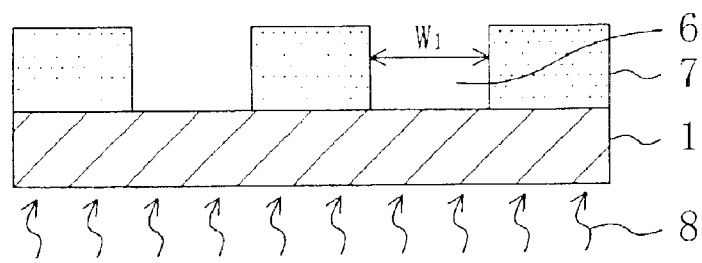
Figure 3E:
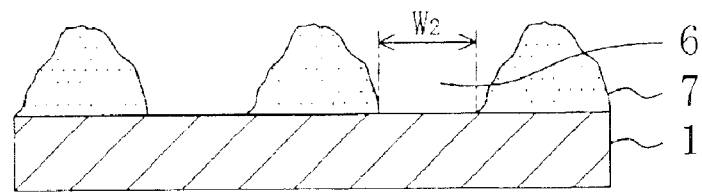

Then, the resist pattern 26 is subjected to annealing 27 at 150° C., so as to allow the resist pattern 26 to flow as shown in FIG. 2E.

In this manner, the size $W_1$ (=0.20 μm) of the opening 25 is reduced to a size $W_2$ (=0.15 μ) while the cross-sectional shape of the opening 25 is minimally degraded. Also, the variation in the size on a wafer plane of the openings 25 is as small as 10% or less.

In Embodiment 2, the resist pattern 26 formed by using the chemically amplified resist material having the aforementioned composition is annealed as described above. Therefore, the thermally crosslinking compound present between the base polymers causes crosslinkage therebetween. As a result, the shape of the opening 25 formed in the resist pattern 26 is not degraded. Accordingly, the size of the opening 25 can be reduced without degrading the shape of the opening 25 formed in the resist pattern 26.

Modification 1 of Embodiment 2

Modification 1 of Embodiment 2 will now be described. Modification 1 is different from Embodiment 2 in the chemically amplified resist material alone, and hence, the chemically amplified resist material alone will be herein described.

The chemically amplified resist material used in Modification 1 contains a first polymer including a hydroxystyrene derivative having an acetal group as a protecting group released by a function of an acid; a second polymer including a norbornene derivative; and an acid generator that generates an acid when irradiated with light. Specifically, the chemically amplified resist material has the following composition:

First polymer: poly((ethoxyethyloxystyrene)—(hydroxystyrene)) (wherein ethoxyethyloxystyrene: hydroxystyrene=40 mol %: 60 mol %) . . . 1 g Second polymer: poly(5-t-butylnorbornene-5-carboxylic acid) . . . 0.2 g Acid generator: 1,4-diphenyldiazodisulfone . . . 0.025 g Solvent: propylene glycol monomethyl ether acetate . . . 4 g According to Modification 1, the second polymer including the norbornene derivative improves the contrast in the thermal flow of the first polymer including the hydroxystyrene derivative having an acetal group, namely, the second polymer suppresses the thermal flow in the vicinity of the opening formed in the resist pattern. Therefore, the shape of the opening formed in the resist pattern is not degraded. Accordingly, the size of the opening can be reduced without degrading the shape of the opening formed in the resist pattern.

The mixing ratio of the second polymer to the first polymer is not particularly specified, and when the mixing ratio is 10 wt % or more, the shape of the opening formed in the resist pattern can be definitely prevented from degrading.

Modification 2 of Embodiment 2

Modification 2 of Embodiment 2 will now be described. Modification 2 is different from Embodiment 2 in the chemically amplified resist material alone, and hence, the chemically amplified resist material alone will be herein described.

The chemically amplified resist material used in Modification 2 contains a first polymer including a hydroxystyrene derivative having an acetal group as a protecting group released by a function of an acid; a second polymer including a norbornene derivative—maleic anhydride (i.e., a polymer of a norbornene derivative and maleic anhydride); and an acid generator that generates an acid when irradiated with light. Specifically, the chemically amplified resist material has any of the following compositions:

(1) First exemplified composition:

First polymer: poly((ethoxyethyloxystyrene)—(hydroxystyrene)) (wherein ethoxyethyloxystyrene: hydroxystyrene=40 mol %: 60 mol %) . . . 1 g Second polymer: poly((5-t-butylnorbornene-5-carboxylic acid)—(maleic anhydride)) (wherein 5-t-butylnorbornene-5-carboxylic acid: maleic anhydride=50 mol %: 50 mol %) . . . 0.2 g Acid generator: 1,4-diphenyldiazodisulfone . . . 0.03 g Solvent: propylene glycol monomethyl ether acetate . . . 4 g (2) Second exemplified composition:

First polymer: poly((tetrahydropyranyloxystyrene)—(hydroxystyrene)) (wherein tetrahydropyranyloxystyrene: hydroxystyrene=40 mol %: 60 mol %) . . . 1 g Second polymer: poly((5-t-butylnorbornene-5-carboxylic acid)—(maleic anhydride)) (wherein 5-t-butylnorbornene-5-carboxylic acid: maleic anhydride=50 mol %: 50 mol %) . . . 0.2 g Acid generator: triphenylsulfonium tosylate . . . 0.03 g Solvent: propylene glycol monomethyl ether acetate . . . 4 g According to Modification 2, the second polymer including the norbornene derivative—maleic anhydride improves the contrast in the thermal flow of the first polymer including the hydroxystyrene derivative having an acetal group, namely, the second polymer suppresses the thermal flow in the vicinity of the opening formed in the resist pattern. Therefore, the shape of the opening formed in the resist pattern is not degraded. Accordingly, the size of the opening can be reduced without degrading the shape of the opening formed in the resist pattern.

The mixing ratio of the second polymer to the first polymer is not particularly specified, and when the mixing ratio is 10 wt % or more, the shape of the opening formed in the resist pattern can be definitely prevented from degrading.

Modification 3 of Embodiment 2

Modification 3 of Embodiment 2 will now be described. Modification 3 is different from Embodiment 2 in the chemically amplified resist material alone, and hence, the chemically amplified resist material alone will be herein described.

The chemically amplified resist material used in Modification 3 contains a first polymer including a hydroxystyrene derivative having an acetal group as a protecting group released by a function of an acid; a second polymer including a norbornene derivative; a third polymer including a norbornene derivative—maleic anhydride (i.e., a polymer of a norbornene derivative and maleic anhydride); and an acid generator that generates an acid when irradiated with light. Specifically, the chemically amplified resist material has the following composition:

First polymer: poly((ethoxyethyloxystyrene)—(hydroxystyrene)) (wherein ethoxyethyloxystyrene: hydroxystyrene=40 mol %: 60 mol %) . . . 1 g Second polymer: poly(5-t-butylnorbornene-5-carboxylic acid) . . . 0.1 g Third polymer: poly((5-t-butylnorbornene-5-carboxylic acid)—(maleic anhydride)) (wherein 5-t-butylnorbornene-5-carboxylic acid: maleic anhydride=50 mol %: 50 mol %) . . . 0.1 g Acid generator: 1,4-diphenyldiazodisulfone . . . 0.025 g Solvent: propylene glycol monomethyl ether acetate . . . 4 g According to Modification 3, the second polymer including the norbornene derivative and the third polymer including the norbornene derivative—maleic anhydride improve the contrast in the thermal flow of the first polymer including the hydroxystyrene derivative having an acetal group, namely, the second and third polymers suppress the thermal flow in the vicinity of the opening formed in the resist pattern. Therefore, the shape of the opening formed in the resist pattern is not degraded. Accordingly, the size of the opening can be reduced without degrading the shape of the opening formed in the resist pattern.

The mixing ratio of the second and third polymers to the first polymer is not particularly specified, and when the mixing ratio is 10 wt % or more, the shape of the opening formed in the resist pattern can be definitely prevented from degrading.

(1) Examples of the polymer having a protecting group released by a function of an acid used in Embodiment 1 or 2 are as follows:

(a) Examples of a methacrylic polymer having such a protecting group:

poly((2-methyl-2-adamantyl methacrylate)—(mevalonic lactone methacrylate)) (wherein 2-methyl-2-adamantyl methacrylate: mevalonic lactone methacrylate=50 mol %: 50 mol %)

poly((2-ethyl-2-adamantyl methacrylate)—(γ-butyrolactone methacrylate)) (wherein 2-ethyl-2-adamanatyl methacrylate: γ-butyrolactone methacrylate=50 mol %: 50 mol %)

(b) Examples of an acrylic polymer having such a protecting group:

poly((2-methyl-2-adamantyl acrylate)—(mevalonic lactone acrylate)) (wherein 2-methyl-2-adamanatyl acrylate: mevalonic lactone acrylate=50 mol %: 50 mol %)

poly((2-ethyl-2-adamantyl acrylate)—(γ-butyrolactone acrylate)) (wherein 2-ethyl-2-adamanatyl acrylate: γ-butyrolactone acrylate=50 mol %: 50 mol %)

(c) Examples of a (methacrylic+acrylic) polymer having such a protecting group:

poly((2-methyl-2-adamantyl acrylate)—(mevalonic lactone methacrylate)) (wherein 2-methyl-2-adamanatyl acrylate: mevalonic lactone methacrylate=50 mol %: 50 mol %)

poly((2-ethyl-2-adamantyl acrylate)—(γ-butyrolactone methacrylate)) (wherein 2-ethyl-2-adamanatyl acrylate: γ-butyrolactone methacrylate=50 mol %: 50 mol %)

(d) Examples of a phenol polymer having such a protecting group:

poly((ethoxyethyloxystyrene)—(hydroxystyrene)) (wherein ethoxyethyloxystyrene: hydroxystyrene=35 mol %: 65 mol %)

poly((methoxymethyloxystyrene)—(hydroxystyrene)) (wherein methoxymethyloxystyrene: hydroxystyrene=40 mol %: 60 mol %)

poly((tetrahydropyranyloxystyrene)—(hydroxystyrene)) (wherein tetrahydropyranyloxystyrene: hydroxystyrene=35 mol %: 65 mol %)

poly((phenoxyethyloxystyrene)—(hydroxystyrene)) (wherein phenoxyethyloxystyrene: hydroxystyrene=32 mol %: 68 mol %)

poly((t-butyloxystyrene)—(hydroxystyrene)) (wherein t-butyloxystyrene hydroxystyrene=30 mol %: 70 mol %)

poly((t-butyloxycarbonyloxystyrene)—(hydroxystyrene)) (wherein t-butyloxycarbonyloxystyrene: hydroxystyrene=30 mol %: 70 mol %)

poly((t-butyloxycarbonylmethyloxystyrene)—(hydroxystyrene)) (wherein t-butyloxycarbonylmethyloxystyrene: hydroxystyrene=28 mol %: 72 mol %)

(e) Examples of a norbornene polymer having such a protecting group:

poly((5-t-butylnorbornene-5-carboxylate)—((norbornene-5-carboxylate)) (wherein 5-t-butylnorbornene-5-carboxylate: norbornene-5-carboxylate=40 mol %: 60 mol %)

poly((5-t-butylnorbornene-5-methylenehexafluoroisopropylalcohol)—(norbornene-5-methylenehexafluoroisopropylalcohol)) (wherein 5-t-butylnorbornene-5-methylenehexafluoroisopropylalcohol: norbornene-5-methylenehexafluoroisopropylalcohol=35 mol %: 65 mol %)

(f) Examples of a polymer including a norbornene derivative—maleic anhydride having such a protecting group:

poly((5-t-butylnorbornene-5-carboxylate)—(maleic anhydride)) (wherein 5-t-butylnorbornene-5-carboxylate: maleic anhydride=50 mol %: 50 mol %)

poly((5-t-butylnorbornene-5-carboxylate)—(norbornene-5-carboxylate)—(maleic anhydride)) (wherein 5-t-butylnorbornene-5-carboxylate: norbornene-5-carboxylate: maleic anhydride=40 mol %: 10 mol %: 50 mol %)

poly((5-t-butylnorbornene-5-methylenehexafluoroisopropylalcohol)—(maleic anhydride)) (wherein 5-t-butylnorbornene-5-methylhexafluoroisopropylalcohol: maleic anhydride=50 mol %: 50 mol %)

poly((5-t-butylnorbornene-5-methylenehexafluoroisopropylalcohol)—(norbornene-5-methylenehexafluoroisopropylalcohol)—(maleic anhydride)) (wherein 5-t-butylnorbornene-5-methylenehexafluoroisopropylalcohol: norbornene-5-methylenehexafluoroisopropylalcohol: maleic anhydride=35 mol %: 15 mol %: 50 mol %)

(g) Examples of a polymer including a norbornene derivative—maleic anhydride and a methacrylic acid derivative having such a protecting group:

poly((5-t-butylnorbornene-5-carboxylate)—(maleic anhydride)—(2-methyl-2-adamantyl methacrylate)-(γ-butyrolactone methacrylate)) (wherein 5-t-butylnorbornene-5-carboxylate: maleic anhydride: 2-methyl-2-admanatyl methacrylate: γ-butyrolactone methacrylate=25 mol %: 25 mol %: 30 mol %: 20 mol %)

poly((5-t-butylnorbornene-5-carboxylate)—(maleic anhydride)-(γ-butyrolactone methacrylate)) (wherein 5-t-butylnorbornene-5-carboxylate: maleic anhydride: γ-butyrolactone methacrylate=40 mol %: 40 mol %: 20 mol %)

(h) Examples of a polymer including a norbornene derivative—maleic anhydride and an acrylic acid derivative having such a protecting group:

poly((5-t-butylnorbornene-5-carboxylate)—(maleic anhydride)—(2-ethyl-2adamantyl acrylate)—(mevalonic lactone acrylate)) (wherein 5-t-butylnorbornene-5carboxylate: maleic anhydride: 2-ethyl-2-adamanatyl acrylate: mevalonic lactone acrylate=25 mol %: 25 mol %: 35 mol %: 15 mol %)

poly((5-t-butylnorbornene-5-carboxylate)—(maleic anhydride)—(mevalonic lactone acrylate)) (wherein 5-t-butylnorbornene-5-carboxylate: maleic anhydride mevalonic lactone acrylate=40 mol %: 40 mol %: 20 mol %)

(2) Examples of the acrylic compound used in Embodiment 1 are as follows:

acrylic acid methyl acrylate ethyl acrylate phenyl acrylate vinyl acrylate (3) An example of the thermally crosslinking compound used in Embodiment 2 is:

2,4,6-tris(ethoxymethyl)amino-1,3-5-s-triazine (melamine compound)

(4) Examples of the hydroxystyrene derivative having an acetal group included in the first polymer used in Modification 1, 2 or 3 of Embodiment 2 are as follows:

ethoxyethyloxystyrene methoxymethyloxystyrene tetrahydropyranyloxystyrene phenoxyethyloxystyrene (5) Examples of the first polymer (the polymer of a hydroxystyrene derivative having an acetal protecting group) used in Modification 1, 2 or 3 of Embodiment 2 are as follows:

poly((ethoxyethyloxystyrene)—(hydroxystyrene)) (wherein ethoxyethyloxystyrene: hydroxystyrene=35 mol %: 65 mol %)

poly((methoxymethyloxystyrene)—(hydroxystyrene)) (wherein methoxymethyloxystyrene: hydroxystyrene= 40 mol %: 60 mol %)

poly((tetrahydropyranyloxystyrene)—(hydroxystyrene)) (wherein tetrahydropyranyloxystyrene: hydroxystyrene=35 mol %: 65 mol %)

poly((phenoxyethyloxystyrene)—(hydroxystyrene)) (wherein phonoxyethyloxystyrene: hydroxystyrene=32 mol %: 68 mol %)

(6) Examples of the norbornene derivative included in the second polymer used in Modification 1 or 3 of Embodiment 2 are as follows:

5-t-butylnorbornene-5-carboxylate 5-t-butyloxycarbonylnorbornene-5-carboxylate 5-t-butylnorbornene-5-methylenehexafluoroisopropylalcohol norbornene-5-carboxylate norbornene-5-methylenehexafluoroisopropylalcohol norbornene (7) Examples of the second polymer (the polymer including a norbornene derivative) used in Modification 1 or 3 of Embodiment 2 are as follows:

poly((5-t-butylnorbornene-5-carboxylate)—(norbornene-5-carboxylate)) (wherein 5-t-butylnorbornene-5-carboxylate: norbornene-5-carboxylate=40 mol %: 60 mol %)

poly((5-t-butylnorbornene-5-methylenehexafluoroisopropylalcohol)—(norbornene-5-methylenehexafluoroisopropylalcohol))(wherein 5-t-butylnorbornene-5-methylenehexafluoro- isopropylalcohol: norbornene-5-methylenehexafluoroisopropylalcohol=35 mol %: 65 mol %)

poly(5-t-butylnorbornene-5-carboxylate)

poly(5-t-butyloxycarbonylnorbornene-5-carboxylate)

poly(5-t-butylnorbornene-5-methylenehexafluoroisopropylalcohol)

poly(norbornene-5-carboxylate)

poly(norbornene-5-methylenehexafluoroisopropylalcohol)

poly(norbornene)

(8) Examples of the norbornene derivative—maleic anhydride included in the second polymer used in Modification 2 or in the third polymer used in Modification 3 of Embodiment 2 are as follows:

5-t-butylnorbornene-5-carboxylate—maleic anhydride 5-t-butyloxycarbonylnorbornene-5-carboxylate—maleic anhydride 5-t-butylnorbornene-5-methylenehexafluoroisopropylalcohol—maleic anhydride norbornene-5-carboxylate—maleic anhydride noroborene-5-methylenehexafluoroisopropylalcohol—maleic anhydride norbornene—maleic anhydride (9) Examples of the second polymer used in Modification 2 or the third polymer used in Modification 3 of Embodiment 2 (the polymer including the norbornene derivative—maleic anhydride) are as follows:

poly((5-t-butylnorbornene-5-carboxylate)—(maleic anhydride)) (wherein 5-t-butylnorbornene-5-carboxylate: maleic anhydride=50 mol %: 50 mol %)

poly((5-t-butylnorbornene-5-carboxylate)—(norbornene-5-carboxylate) (maleic anhydride)) (wherein 5-t-butylnorbornene-5-carboxylate: norbornene-5-carboxylate: maleic anhydride=40 mol %: 10 mol %: 50 mol %)

poly((5-t-butylnorbornene-5-methylenehexafluoroisopropylalcohol)—(maleic anhydride)) (wherein 5-t-butylnorbornene-5-methylenehexafluoroisopropylalcohol: maleic anhydride=50 mol %: 50 mol %)

poly((5-t-butylnorbornene-5-methylenehexafluoroisopropylalcohol)—(norbornene-5-methylenehexafluoroisopropylalcohol)—(maleic anhydride)) (wherein 5-t-butylnorbornene-5-methylenehexafluoroisopropylalcohol: norbornene-5-methylenehexafluoroisopropylalcohol: maleic anhydride=35 mol %: 15 mol %: 50 mol %)

poly((5-t-butylnorbornene-5-carboxylate)—(maleic anhydride)) (wherein 5-t-butylnorbornene-5-carboxylate: maleic anhydride=50 mol %: 50 mol %)

poly((5-t-butyloxycarbonylnoroborene-5-carboxylate)—(maleic anhydride)) (wherein 5-t-butyloxycarbonylnoroborne-5-carboxylate: maleic anhydride=50 mol %: 50 mol %)

poly((5-t-butylnorbornene-5-methylenehexafluoroisopropylalcohol)—(maleic anhydride)) (wherein 5-t-butylnorbornene-5-methylenehexafluoroisopropylalcohol: maleic anhydride=50 mol %: 50 mol %)

poly((norbornene-5-carboxylate)—(maleic anhydride)) (wherein norbornene-5-carboxylate: maleic anhydride=50 mol %: 50 mol %)

poly((norbornene-5-methylenehexafluoroisopropylalcohol)—(maleic anhydride)) (wherein norbornene-5-methylenehexafluoroisopropylalcohol: maleic anhydride=50 mol %: 50 mol %)

poly((norbornene)—(maleic anhydride)) (wherein norbornene: maleic anhydride=50 mol %: 50 mol %)

(10) Examples of the acid generator used in Embodiment 1, 2, Modification 1, 2 or 3 of Embodiment 2 are as follows:

1,4-diphenyldiazodisulfone triphenylsulfonium tosylate camphorimino tosylate naphthylimino tosylate camphorimino trifluoromethanesulfonate naphthylimino trifluoromethanesulfonate triphenylsulfonium trifluoromethanesulfonate triphenylsulfonium nonafluorobutanesulfonate diphenyliodonium trifluoromethanesulfonate diphenyliodonium nonafluorobutanesulfonate di(4-t-butylphenyl)iodonium trifluoromethanesulfonate di(4-t-butylphenyl)iodonium nonafluorobutanesulfonate

What is claimed is:

1. A pattern formation method comprising the steps of:

forming a resist film from a chemically amplified resist material including a base polymer having a protecting group released by a function of an acid, an acrylic compound and an acid generator that generates an acid when irradiated with light;

selectively irradiating said resist film with exposing light for pattern exposure;

forming a resist pattern having a hole or groove opening by developing said resist film after the pattern exposure; and reducing a size of said opening by irradiating said resist pattern with laser light with annealing.

2. The pattern formation method of claim 1, wherein said acrylic compound is acrylic acid or acrylate.

3. The pattern formation method of claim 1, wherein said protecting group is an acetal group, a t-butyl group or a t-butyloxycarbonyl group.

4. The pattern formation method of claim 1, wherein said size of said opening after reducing is 0.15 $\mu$m or less.

5. The pattern formation method of claim 1, wherein said resist pattern after reducing has a different shape from said resist after developing and before reducing.

6. The pattern formation method of claim 1, wherein said exposing light is ArF eximer layer.

7. A pattern formation method comprising the steps of:

forming a resist film from a chemically amplified resist material including a base polymer having a protecting group released by a function of an acid, a thermally crosslinking compound for thermally crosslinking said base polymer and an acid generator that generates an acid when irradiated with light;

selectively irradiating said resist film with exposing light for pattern exposure;

forming a resist pattern having a hole or groove opening by developing said resist film after the pattern exposure; and reducing a size of said opening by laser light with annealing said resist pattern.

8. The pattern formation method of claim 7, wherein said thermally crosslinking compound is a melamine compound.

9. The pattern formation method of claim 7,
wherein said protecting group is an acetal group, a t-butyl group or a t-butyloxycarbonyl group.

10. A pattern formation method comprising the steps of:
forming a resist film from a chemically amplified resist material containing a first polymer including a hydroxystyrene derivative having an acetal group as a protecting group released by a function of an acid, a second polymer including a norbornene derivative and an acid generator that generates an acid when irradiated with light;
selectively irradiating said resist film with exposing light for pattern exposure;
forming a resist pattern having a hole or groove opening by developing said resist film after the pattern exposure; and
reducing a size of said opening by laser light with annealing said resist pattern.

11. The pattern formation method of claim 10,
wherein said acetal group is an ethoxyethyl group or a tetrahydropyranyl group.

12. The pattern formation method of claim 10,
wherein said size of said opening after reducing is 0.15 $\mu$m or less.

13. The pattern formation method of claim 10,
wherein said resist pattern after reducing has a different shape from said resist after developing and before reducing.

14. The pattern formation method of claim 10,
wherein said exposing light is ArF eximer layer.

15. A pattern formation method comprising the steps of:
forming a resist film from a chemically amplified resist material containing a first polymer including a hydroxystyrene derivative having an acetal group as a protecting group released by a function of an acid, a second polymer including a norbornene derivative—maleic anhydride and an acid generator that generates an acid when irradiated with light;
selectively irradiating said resist film with exposing light for pattern exposure;
forming a resist pattern having a hole or groove opening by developing said resist film after the pattern exposure; and
reducing a size of said opening by laser light with annealing said resist pattern.

16. The pattern formation method of claim 15,
wherein said acetal group is an ethoxyethyl group or a tetrahydropyranyl group.

17. A pattern formation method comprising the steps of:
forming a resist film from a chemically amplified resist material containing a first polymer including a hydroxystyrene derivative having an acetal group as a protecting group released by a function of an acid, a second polymer including a norbornene derivative, a third polymer including a norbornene derivative—maleic anhydride and an acid generator that generates an acid when irradiated with light;
selectively irradiating said resist film with exposing light for pattern exposure;
forming a resist pattern having a hole or groove opening by developing said resist film after the pattern exposure; and
reducing a size of said opening by laser light with annealing said resist pattern.

18. The pattern formation method of claim 17,
wherein said acetal group is an ethoxyethyl group or a tetrahydropyranyl group.

* * * * *